United States Patent [19]

Furukawa et al.

[11] Patent Number: 5,698,367
[45] Date of Patent: Dec. 16, 1997

[54] LITHOGRAPHIC PRINTING PLATE

[75] Inventors: Akira Furukawa; Motozo Yamano; Satoshi Shimonodan, all of Tokyo, Japan

[73] Assignee: Mitsubishi Paper Mills, Limited, Tokyo, Japan

[21] Appl. No.: 568,614

[22] Filed: Dec. 7, 1995

[30] Foreign Application Priority Data

| Dec. 8, 1994 | [JP] | Japan | 6-304761 |
| Dec. 8, 1994 | [JP] | Japan | 6-304762 |
| Dec. 8, 1994 | [JP] | Japan | 6-304763 |

[51] Int. Cl.⁶ .................................. G03C 1/06
[52] U.S. Cl. ................... 430/264; 430/204; 430/227; 430/232; 430/627; 430/629; 430/630; 430/631
[58] Field of Search .................... 430/204, 227, 430/232, 264, 627, 629, 630, 631

[56] References Cited

U.S. PATENT DOCUMENTS

| 3,879,205 | 4/1975 | Fitzgerald et al. | 430/627 |
| 4,160,670 | 7/1979 | Tsubai et al. | 430/204 |
| 4,278,759 | 7/1981 | Saleck et al. | 430/627 |
| 4,722,885 | 2/1988 | Yokoyama et al. | 430/627 |
| 4,948,699 | 8/1990 | Nishinoiri et al. | 430/204 |
| 5,108,871 | 4/1992 | Yamano et al. | 430/204 |
| 5,153,115 | 10/1992 | Yasunami et al. | 430/627 |
| 5,215,879 | 6/1993 | Suzuki et al. | 430/627 |
| 5,362,613 | 11/1994 | Shiratsuchi et al. | 430/627 |
| 5,437,957 | 8/1995 | Yamano et al. | 430/264 |

*Primary Examiner*—Geraldine Letscher
*Attorney, Agent, or Firm*—Cushman Darby & Cushman IP Group of Pillsbury Madison & Sutro LLP

[57] ABSTRACT

Disclosed is a lithographic printing plate having a silver halide emulsion layer and a layer containing physical development nuclei on a support, the improvement wherein a water-soluble polymer having a structural unit represented by the formula (I):

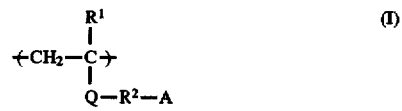

wherein $R^1$ represents H or alkyl; Q represents divalent linking group; $R^2$ represents divalent linking group or direct bond; and A represents a functional group represented by the formula: $-S-C(=N-R^4)-NH-R^3$, $-Z-X(=Y)-(R^5)_m$ or $-W-(SH)_n$ where respective substituents are defined in the specification is contained in the layer containing physical development nuclei.

11 Claims, No Drawings

LITHOGRAPHIC PRINTING PLATE

BACKGROUND OF THE INVENTION

1. Field of the Invention

This invention relates to a photosensitive material for production of lithographic printing plates by utilizing the silver complex diffusion transfer process. More specifically, it relates to improved lithographic printing plates having high sensitivity and no toning (or scum) on printing with excellent preservation stability.

2. Prior Art

A lithographic printing plate utilizing the silver complex diffusion transfer process comprises greasy ink receptive oleophilic image portions and ink repellent oleophobic non-image portions, the latter being generally water receptive hydrophilic areas. Accordingly, the customary lithographic printing is carried out by feeding both water and colored ink to the printing plate surface to allow the image portions to receive preferentially the colored ink and the non-image portions preferentially water and then transferring the ink deposited on image portions onto a substrate such as paper for example. In order to obtain a print of good quality, therefore, it is necessary that oleophilic activity of the image portions and hydrophilic activity of the non-image portions may completely repel the ink.

There has already been a printing plate in actual use, which is produced by providing a pattern in metallic silver on the plate surface by utilizing the silver diffusion transfer technique and thereafter making the pattern oleophilic or ink receptive. Examples are lithographic printing plates proposed by the present applicants in U.S. Pat. No. 3,728,114 and U.S. Pat. No. 4,160,670, which comprise a physical development nuclei layer of heavy metals or sulfides thereof on a silver halide emulsion layer of the lithographic printing plate. As previously mentioned, an ideal lithographic printing plate is such that the image portion adequately receives an ink while the non-image portion perfectly repels the ink so that no toning on printing may occur. For this reason, various methods for rendering the non-image portion insensitive to oil have been studied according to the type of printing plate material and the printing process.

As well known in printing business circles, the toning in lithographic does not originate from single source, but is generally associated with a combination of factors such as, for example, intrinsic properties of the printing plate; qualities of the printing ink, damping water and printing paper; conditions of the printing press; and environmental factors such as temperature and humidity during printing. Although it is important to carry out printing under printing conditions and environmental conditions maintained at optimal levels. However, there exists a demand from the practical standpoint for printing plates which can be used under conditions in the range as broad as possible.

In recent years, accompanied with the increment in amounts of information, it has been strongly demanded to treat information rapidly and also desired to shorten a plate making time, and to improve sensitivity of a photosensitive printing material including a lithographic printing plate.

In U.S. Pat. No. 4,160,670 proposed by the present applicants, there have been described in detail about an effect of a binder contained in the layer which contains physical development nuclei exerting printing, and synthetic polymer compounds to be used are disclosed therein. However, the lithographic printing plate materials disclosed therein have disadvantages in that photographic characteristics (soft gradation) and printing characteristics are liable to deteriorate with the lapse of time whereby press life is shortened and toning on printing is liable to occur, and thus, they are qualitatively insufficient.

SUMMARY OF THE INVENTION

An object of the present invention is to overcome the above disadvantages and to provide a lithographic printing plate having high sensitivity, stable photographic characteristics with the lapse of time and less ink toning on printing.

The problems of the present invention can be resolved by using the following means. That is, in a lithographic printing plate having a silver halide emulsion layer and a layer containing physical development nuclei on a support, which utilizes the silver complex diffusion transfer process, the improvement wherein a water-soluble polymer having a structural unit or a recurring unit represented by the formula (I):

wherein $R^1$ represents a hydrogen atom or a lower alkyl group having 1 to 6 carbon atoms; Q represents a divalent linking group; $R^2$ represents a divalent linking group or a direct bonding arm (single bond); and A represents $-S-C(=N-R^4)-NH-R^3$, $-Z-X(=Y)-(R^5)_m$ or $-W-(SH)_n$;

where $R^3$ represents a hydrogen atom, an alkyl group, a phenyl group, an amino group or an amidino group; $R^4$ represents a hydrogen atom or an amino group; Z represents a sulfur atom, a nitrogen atom or a NH group; X represents a carbon atom or a phosphorus atom; Y represents an oxygen atom, a sulfur atom or $=N-$; $R^5$ represents an alkyl group, an alkoxy group, an aryl group, a pyrrolidino group, a piperidino group, a mercapto group or a thiosemicarbazido group; m is 1 when X is a carbon atom or 2 when X is a phosphorus atom; provided that when Z is a nitrogen atom, two $-Q-R^2-$'s are bonded thereto, when X is a phosphorus atom, two $R^5$'s may be the same or different and are alkoxy groups bonded to X; when Y is $=N-$, X, Y and $R^5$ form a heterocyclic ring; and when Z is a nitrogen atom or a NH group, the moiety $-X(=Y)-R^5$ represents a dithiocarbamic acid group, a salt thereof or a N-substituted thiourea residue; W represents a nitrogen-containing heterocyclic ring; and n represents an integer of 1 or 2, is contained in the layer containing physical development nuclei, whereby the object of the present invention is accomplished.

DESCRIPTION OF THE PREFERRED EMBODIMENTS

In the present invention, by adding the water soluble polymer having a structural unit represented by the above formula (I) in the layer containing nuclei for physical development, a lithographic printing plate having high sensitivity, stable photographic characteristics with the lapse of time and less ink toning on printing can be obtained.

Examples of the water-soluble polymer having a functional group represented by the following formula (A), (B) or (C):

 (A)

wherein $R^3$ and $R^4$ have the same meanings as defined above,

 (B)

wherein Z, X, Y, $R^5$ and m have the same meanings as defined above,

 (C)

wherein W and n have the same meanings as defined above, includes a water-soluble polymer having a structural unit represented by the following formula (A-1), (B-1) or (C-1), respectively.

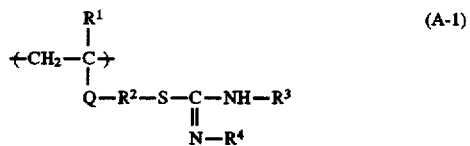 (A-1)

wherein $R^1$, Q, $R^2$, $R^3$ and $R^4$ have the same meanings as defined above,

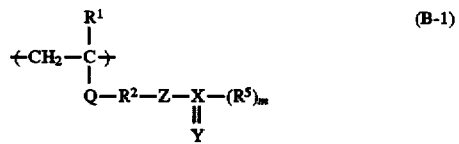 (B-1)

wherein $R^1$, Q, $R^2$, Z, X, Y, $R^5$ and m have the same meanings as defined above;

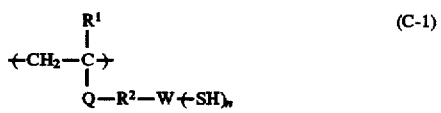 (C-1)

wherein $R^1$, Q, $R^2$, W and n have the same meanings as defined above; or —Q—$R^2$— represents a divalent linking group represented by the following formula (C-2):

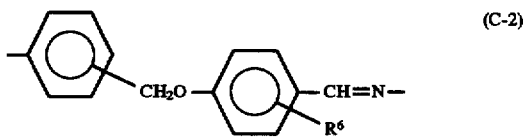 (C-2)

where $R^6$ represents a hydrogen atom or a methoxy group.

In the above formula (I), $R^1$ represents a hydrogen atom or an alkyl group having 1 to 6 carbon atoms such as a methyl group, an ethyl group, a propyl group, a butyl group, etc., preferably a hydrogen atom or a methyl group.

Q in the formula (I) represents a divalent linking group such as an alkylene group having 2 to 7 carbon atoms including a methylene group, an ethylene group, a propylene group, a butylene group, etc.; a phenylene group, an aralkylene group, a COO group, a NHCOO group, a NHCOOC$_2$H$_4$ group and a CONH group, preferably a methylene group, a phenylene group, an aralkylene group, a COO group and a CONH group; and Q may comprise a combination of two or more above linking groups.

$R^2$ in the formula (I) represents a divalent linking group selected from the group consisting of an alkylene group having 2 to 7 carbon atoms such as a methylene group, an ethylene group, a propylene group, a butylene group, etc.; an alkyleneoxy group having 2 to 7 carbon atoms such as a methyleneoxy group, an ethyleneoxy group, a propyleneoxy group, a butyleneoxy group, etc.; and an arylene group such as a phenylene group, a naphthalene group, etc.; or a direct bonding arm; preferably a methyleneoxy group, a phenylene group or a direct bonding arm; or when A is a group represented by the formula (C), a divalent linking group represented by the formula:

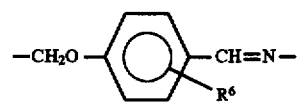

wherein $R^6$ has the same meaning as defined above, and $R^2$ may comprise a combination of two or more above divalent linking groups.

In the above formula (I), the substituent A represents a substituent represented by the formula (A), (B) or (C), and respective substituents therein mean as mentioned below.

$R^3$ in the formula (A) represents a hydrogen atom; an alkyl group having 1 to 6 carbon atoms such as a methyl group, an ethyl group, a propyl group, a butyl group, etc.; a phenyl group; an amino group; or an amidino group; each of respective substituents other than the hydrogen atom may be substituted by an alkyl group preferably having 1 to 6 carbon atoms; preferably $R^3$ is a hydrogen atom or an amidino group.

$R^4$ in the formula (A) represents a hydrogen atom, an alkyl group or a substituted or unsubstituted amino group; preferably a hydrogen atom.

In the structural unit (A-1), the structural unit may be in the form of an acid addition salt such as a hydrochloride, hydrobromide, etc.

Z in the formula (B) represents a sulfur atom, a nitrogen atom or a NH group, preferably a sulfur atom or a NH group.

X in the formula (B) represents a carbon atom or a phosphorus atom, preferably a carbon atom.

Y in the formula (B) represents an oxygen atom, a sulfur atom or =N—, and when X is a carbon atom, Y is preferably an oxygen atom or a sulfur atom while when X is a phosphorus atom, Y is preferably a sulfur atom. When Y is =N—, X, Y and $R^5$ in the formula (B) form a heterocyclic ring such as a benzimidazole ring, a benzothiazole ring, a benzthiadiazole ring, etc. and the heterocyclic ring may be substituted by an alkyl group having 1 to 6 carbon atoms, an aryl group such as a phenyl group, etc.

When X is a carbon atom, m is 1 and when X is a phosphorus atom, m is 2.

When X is a carbon atom, $R^5$ in the formula (B) represents an alkyl group having 1 to 6 carbon atoms such as a methyl group, an ethyl group, a propyl group, a butyl group, etc.; an alkoxy group having 1 to 6 carbon atoms such as a methoxy group, an ethoxy group, a propoxy group, a butoxy group, etc.; an aryl group such as a phenyl group, a naphthyl group, etc.; a pyrrolidino group; a piperidino group; a mercapto group or a thiosemicarbazido group, etc.; or an allylamino group. When X is a phosphorus atom, two $R^5$'s may be the same or different and each of $R^5$'s represents an alkoxy group having 1 to 6 carbon atoms such as a methoxy group, an ethoxy group, a propoxy group, a butoxy group, etc., preferably an ethoxy group. When Z is a nitrogen atom or a NH group, the moiety —X(=Y)—R⁵ represents a dithiocarbamic acid group, a salt thereof such as a sodium salt, a potassium salt, etc., or a N-substituted thiourea residue.

W in the formula (C) represents a nitrogen-containing heterocyclic substituent having a mercapto group, more specifically atomic groups necessary for formation of an oxadiazole ring, thiadiazole ring, selenadiazole ring, triazole ring, triazine ring, benzothiazole ring, etc., and these rings may be bonded via a benzene ring.

n in the formula (C) represents an integer of 1 or 2, preferably 1.

Specific examples of providing the structural unit represented by the formula (A-1) may include, for example, those obtained by polymerizing the monomers (a-1) to (a-12) as mentioned below.

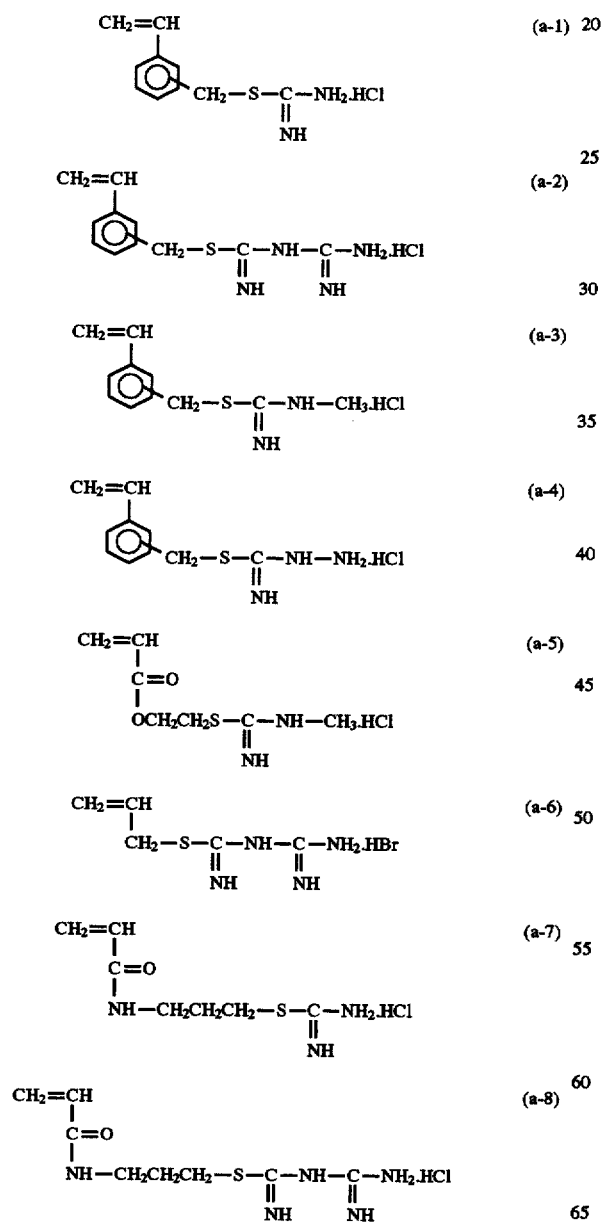

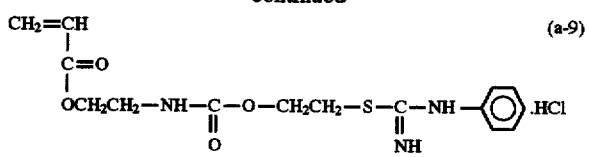

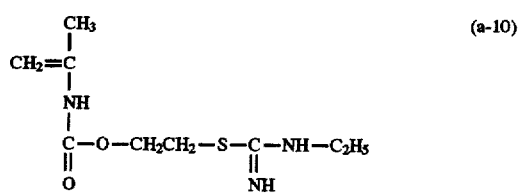

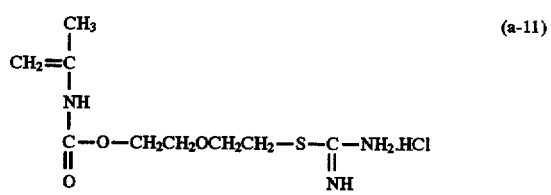

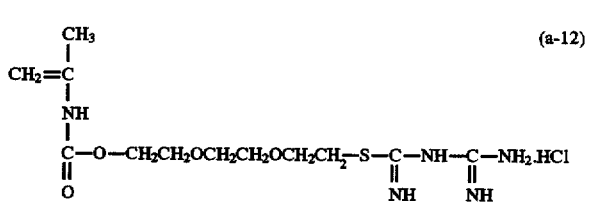

Specific examples of the structural unit represented by the formula (B-1) may include, for example, those obtained by polymerizing the monomers (b-1) to (b-12) as mentioned below.

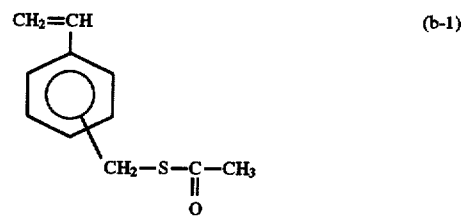

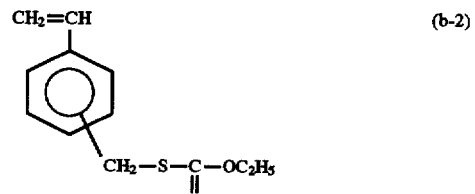

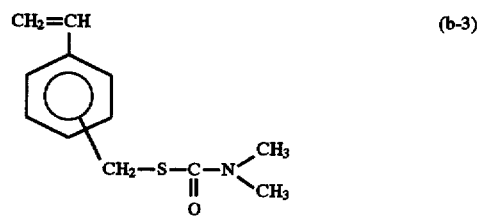

-continued
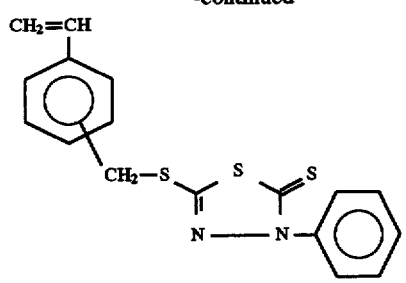
(b-4)
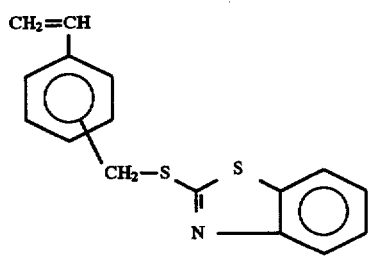
(b-5)
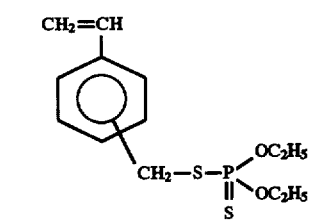
(b-6)
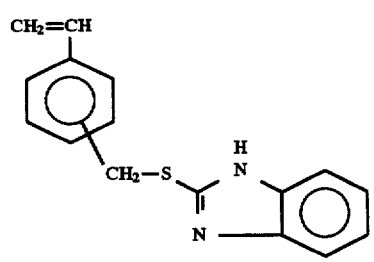
(b-7)
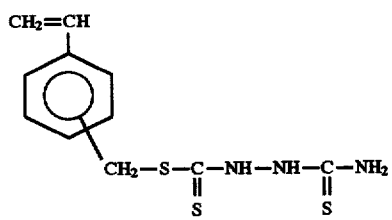
(b-8)
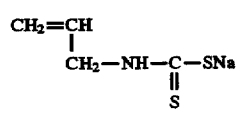
(b-9)
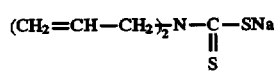
(b-10)
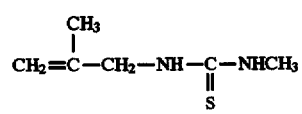
(b-11)
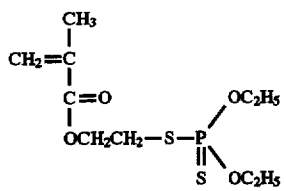
(b-12)
Specific examples of the structural unit represented by the formula (C-1) may include, for example, those obtained by polymerizing the monomers (c-1) to (c-11) as mentioned below.
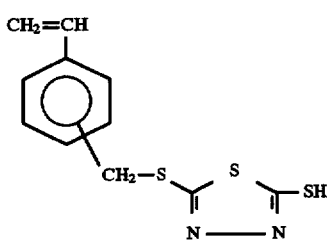
(c-1)
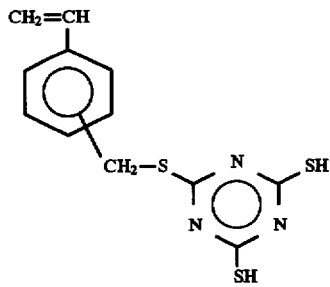
(c-2)
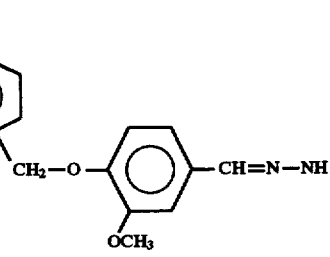
(c-3)
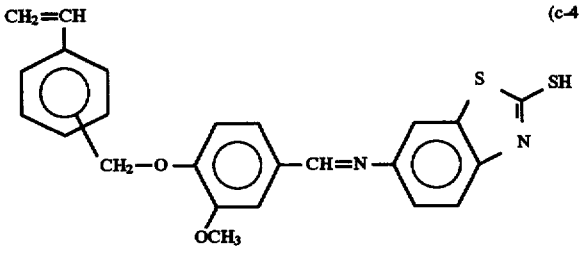
(c-4)
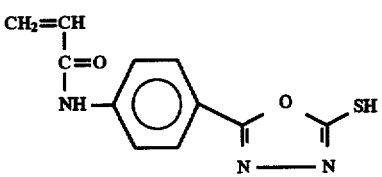
(c-5)

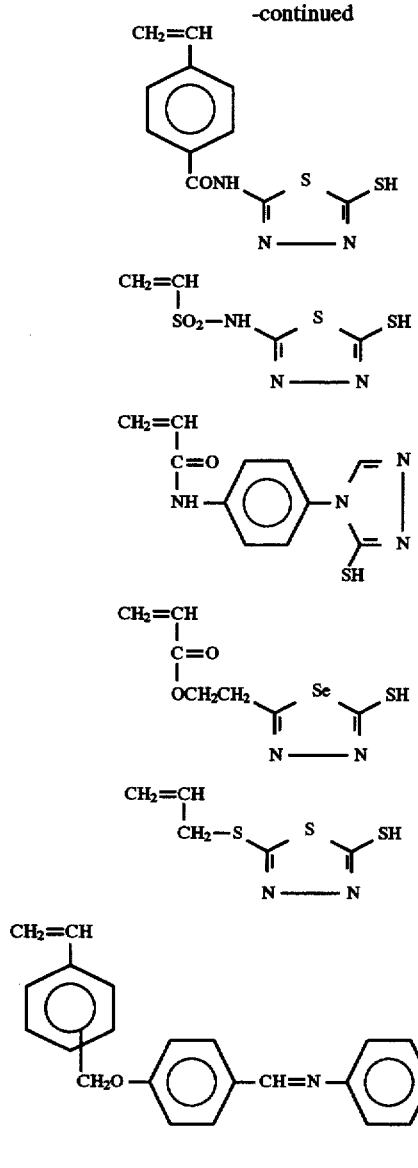

Further, as the water-soluble polymer to be contained in the layer containing the physical development nuclei, those having the structural unit represented by the above formula (A), (B) or (C) as a functional group can be used whereby the effects of the present invention can be obtained. The water-soluble polymer may be a homopolymer of the monomer unit represented by the formula (A-1), (B-1) or (C-1) or a copolymer with other monomer units. As the other structural units which can be introduced in the copolymer having the structural unit represented by the formula (A-1), (B-1) or (C-1) of the present invention, there may be mentioned a structural unit represented by the formula (D):

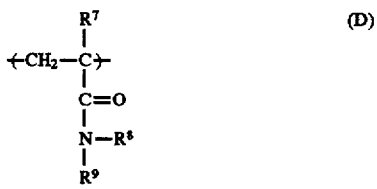

wherein $R^7$ represents a hydrogen atom or a methyl group; $R^8$ represents a hydrogen atom or a methyl group; and $R^9$ represents a hydrogen atom, an alkyl group preferably having 1 to 6 carbon atoms, an alkoxymethyl group preferably having 1 to 6 alkoxy carbon atoms or a hydroxymethyl group.

Preferred examples of the monomer providing the structural unit represented by the formula (D) may include, for example, acrylamide, methacrylamide, N,N-dimethylacrylamide, N-isopropylacrylamide, N-methylolacrylamide, etc. By incorporating such a monomer in the water-soluble polymer as a component for the copolymer, the viscosity of the water-soluble polymer can be controlled suitably whereby coating property of a coating solution containing the polymer can be improved and a lithographic printing plate having good press life can be obtained.

The formulating ratio of the structural unit represented by the formula (A-1) and that of (D) in the copolymer is preferably 0.1% by weight to 100% by weight of (A-1) and the reminder being (D), more preferably 1 to 40% by weight of (A-1). In the above range, the effects of the present invention can be most effectively admitted. If the amount of (A-1) is less than 0.1% by weight, the effects of the present invention cannot sometime be obtained.

The formulating ratio of the structural unit represented by the formula (B-1) or (C-1) and that of (D) in the copolymer is preferably 0.1% by weight to 50% by weight of (B-1) or (C-1) and the reminder being (D), more preferably 1 to 30% by weight of (B-1) or (C-1). In the above range, the effects of the present invention can be most effectively admitted. If the amount of (B-1) or (C-1) is less than 0.1% by weight, the effects of the present invention cannot sometime be obtained, while if it exceeds 50% by weight, a formed copolymer sometimes has insufficient in solubility to water so that when coating of the polymer solution is carried out, some problems may arise.

The objects of the present invention can be accomplished by using the homopolymer having a functional group or a copolymer containing the structural unit as mentioned above, but depending on the respective purposes, it is preferred to modify the characteristics of the water-soluble polymer. For example, in order to heighten hydrophobicity of the layer containing physical development nuclei with a some extent and to improve ink-receptive characteristics on printing, the third or the fourth copolymerizable component, etc. such as various kinds of hydrophobic monomer including alkyl(meth)acrylate (saturated alkyl ester having from 1 to 20 carbon atoms, in the present specification, "(meth)acrylate" means acrylate or methacrylate), benzyl(meth)acrylate, styrene and derivatives thereof may be incorporated in the water-soluble copolymer. Or else, for other various purposes, there may be incorporated a monomer having a carboxyl group such as (meth)acrylic acid, crotonic acid, itaconic acid and maleic acid, or a salt thereof; a monomer having a sulfonic acid group such as sodium vinylsulfonate, sodium p-styrenesulfonate and sodium (meth)allylsulfonate; a monomer having a hydroxyl group such as 2-hydroxyethyl(meth)acrylate, hydroxypropyl (meth)acrylate and polyethyleneglycol mono(meth)acrylate; a monomer having a methoxy group and an ethyleneoxy group such as methoxyethyl(meth)acrylate, methoxypolyethyleneglycol mono(meth)acrylate and poly(ethyleneglycol)mono(meth)acrylate; a monomer having a basic nitrogen atom such as vinylimidazole, 4-vinylpyridine, 2-vinylpyridine, N,N-dimethylaminoethyl(meth)acrylate, N,N-diethylaminoethyl(meth)acrylate, N,N-dimethylaminopropyl acrylamide, allylamine and diallylamine; a vinyl ester derivative such as vinyl acetate, vinyl propionate and vinyl benzoate; N-vinylpyrrolidone; acrylonitrile; methyl vinyl ether; butyl vinyl ether, etc. Further, as a bifunctional monomer, a monomer such as divinylbenzene, ethyleneglycol di(meth)acrylate and methylenebisacrylamide may be incorporated with a small amount.

However, the content of the above monomers is preferably 50% by weight or less based on the total weight of the copolymer when the above monomers are to be incorporated into the water-soluble polymer. If the amount thereof exceeds the above range, disadvantages of lowering in water-solubility of the resulting polymer or worsening the degree of ink-toning on printing will appear in some cases.

The molecular weight of the water-soluble polymer obtained by the present invention is preferably in the range of 5,000 to 1,000,000, more preferably 10,000 to 300,000 in terms of the weight average molecular weight (Mw). If the molecular weight exceeds the above range, the viscosity of the composition becomes high so that coating is sometimes difficult. On the other hand, if a polymer having a molecular weight lower than the above range is used to prepare a printing plate, press life thereof is sometimes lowered.

The water-soluble polymer of the present invention can be added before or after coating the physical development nuclei, but in view of stability in quality of the product and easiness for production, it is most advantageous to apply the polymer simultaneously with the physical development nuclei. Whereas there are some degree of dependency upon the type, quantity and nature of the colloidal substance used as nuclei for physical development, the amount of the polymer applied per square meter predominantly affects the printing characteristics of the printing plate to be formed. The application rate is usually 2 g/m² or less, preferably 0.01 to 1 g/m².

The water-soluble polymer of the present invention can be manufactured by the common radical polymerization. As the polymerization solvent, in addition to water alone, various kinds of alcohols or the like which are miscible with water can be preferably used in combination with water in order to control the polymerization degree suitably. At the polymerization, it is preferred to polymerize a monomer having a mercapto group and a polymerizable double bond through a heterocyclic ring, e.g., a monomer providing a recurring unit represented by the formula (C-1). In order to prevent a chain transfer reaction due to such a mercapto group, it is preferred to carry out the polymerization reaction with the state in which the mercapto group is changed to the form of a salt by adding a base such as sodium hydroxide, potassium hydroxide and sodium hydrogen carbonate. Or else, in order to protect the mercapto group, monomers to which various esterifications are subjected are previously synthesized and deprotection is carried out after polymerization to obtain a desired polymer. Also, a precursor polymer is previously synthesized and then a low molecular compound having a functional group as shown by the formula (C) may be bonded to the polymer. In such a method, there are possibility of causing problems that the low molecular compound which is not bound to the polymer is generally required to be removed and further the functional groups with a quantitatively calculated amount can be difficultly bound to the precursor polymer.

The polymer of the present invention can be used in combination with at least one of various kinds of water-soluble polymers such as gelatin, polyvinyl alcohol, polyvinylpyrrolidone, hydroxyethyl cellulose, carboxymethyl cellulose, polyacrylamide, polyacrylic acid, dextran, pullulan, various kinds of modified starch, etc.

In the silver complex transfer process, the exposed silver halide photographic element is generally treated with an alkaline mono-bath developer, an antioxidant for the developer, and a solvent for silver halides. According to the generally accepted concept concerning the silver complex diffusion transfer process, the silver halide particles rendered developable by exposure (contrary to the case of a silver halide photosensitive material of the direct positive type) are immediately reduced to metallic silver (chemical development) by a reducing agent (a developer component) in the said composition, while, on the other hand, the unexposed silver halide particles, which are difficult to reduce directly, become soluble by once complexing with the silver halide solvent such as a thiocyanate, an amine, etc. in the said composition and diffuse to be reduced in contact with the surface of the physical development nuclei which act as reducing catalyst (physical development). The water-soluble polymer according to the present invention shows its effects sufficiently by existing at around the physical development nuclei, which interacts with a silver ion due to its structural characteristics and sometimes forms a complex. In this case, it can be supposed that the silver complex diffused by the silver halide solvent is captured by the water-soluble polymer according to the present invention whereby the silver ions for physical development are effectively supplied to the physical development nuclei and also the formed physical development silver sufficiently grow in the matrix of the said water-soluble polymer whereby the silver image is fixed firmly. When a lithographic printing plate is formed according to this system, adhesiveness of the silver image to the substrate is an extremely important factor for heightening press life and sufficient growth of the same is also an important factor for controlling ink receptivity. The water-soluble polymer obtained by the present invention provides such extremely preferable effects to the physical development silver and also, at the non-silver image portion at which the physical development silver do not inherently exist, it has an effect of heightening hydrophilicity of the surface of the plate by existing at the surface of the silver complex photosensitive material. Thus, in the lithographic printing plate, ink repellent property can be heightened at the non-silver image portion whereby an extremely preferred effect that toning on printing is hardly occurred can be obtained.

The water-soluble polymer having the recurring unit represented by the formula (C) is characterized in that it has a nitrogen-containing heterocyclic substituent having a mercapto group. In U.S. Pat. No. 4,160,670 mentioned above as a prior art, there is described a polymer having a mercapto group which is used for the similar purpose as that of the present invention. In this reference, the mercapto group is bound directly to the polymer without via the heterocyclic ring so that reactions such as oxidation due to oxygen, etc. in air or formation of a disulfide bond are generated in the polymer aqueous solution and in the coated film. Thus, there are disadvantages that the characteristics of the silver halide photosensitive material are changed with a lapse of time or the printing characteristics such as press life or ink receptivity are markedly changed during preservation. In contrast, when the mercapto group is bound through the nitrogen-containing heterocyclic group, tautomerism of thiol-thione occurs between the nitrogen atom in the heterocyclic group and the mercapto group and the mercapto group substantially exists in the form of thione in the solution or in the solid film state. In the present invention, stability with a lapse of time of the polymer to which the mercapto group is bound is remarkably improved and no bad effect on photographic characteristics of the photosensitive material or printing characteristics after preservation can be admitted.

Further, the mercapto group is bound to the heterocyclic ring so that acidity of the mercapto group is increased and it can be easily changed to a mercaptide such as a sodium salt, etc. by adding a base such as sodium hydroxide, sodium hydrogen carbonate, etc. Thus, the present invention has a characteristic that a desired polymer can be synthesized stably without occurring any chain transfer reaction during the polymerization. To the contrary, when the polymer having the mercapto group directly bound thereto without via the heterocyclic group is synthesized, formation of such a mercaptide is difficult under the pH range to be used in the usual polymerization conditions whereby various problems are involved for synthesizing the polymer.

The developing agent may be contained in either or both of the photosensitive material or/and the developer in the development processing of a usual photosensitive silver halide photographic material. The development processing of the present invention can be carried out according to the conventional manner and the developing speed can be controlled.

The developing agent to be used in the present invention may be mentioned, for example, the hydroxybenzene type such as hydroquinone, catechol and pyrogallol, and derivatives thereof such as methylhydroquinone, dimethylhydroquinone, chlorohydroquinone, 4-methylcatechol, 4-t-butylcatechol, gallic acid, methyl gallate, ethyl gallate, etc.; p-aminophenol and derivatives thereof such as N-methyl-p-aminophenol, 2,4-diaminophenyl sulfate, etc.; and 1-phenyl-3-pyrazolidone and 1-phenyl-4-methyl-3-pyrazolidone, etc. These developing agent are applied as an aqueous solution or as a solution in a water-miscible organic solvent such as methanol, ethanol, propanol, acetone, ethylene glycol, etc. The solution containing a developing agent is applied preferably together with a solution containing colloidal heavy metals or colloidal heavy metal sulfides.

The sufficient amount of the developing agent to be applied is, for example, 0.02 g/m² to 1.0 g/m² for hydroquinone and 0.001 g/m² to 0.1 g/m² for 1-phenyl-3-pyrazolidone. The photosensitive material obtained by use of a developing agent of the present invention is improved in printing toning and has advantages of high contrast in photographic image as well as in printing characteristics, desirable sharpness of the image, excellent resolving power and little variation in properties with the lapse of time.

This invention is characterized by the specifically composed image receiving layer containing a specific polymer in a lighographic printing plate utilizing silver complex diffusion transfer process, and thus, no restriction is placed on other features of the printing element such as type of the support, composition of the silver halide emulsion layer, procedure of silver complex diffusion transfer treatment, etc.

Next, polymers having functional groups according to the present invention are exemplified but the present invention is not limited by these examples. The numerals in the formulae represent % by weight of the recurring unit in the copolymer composition.

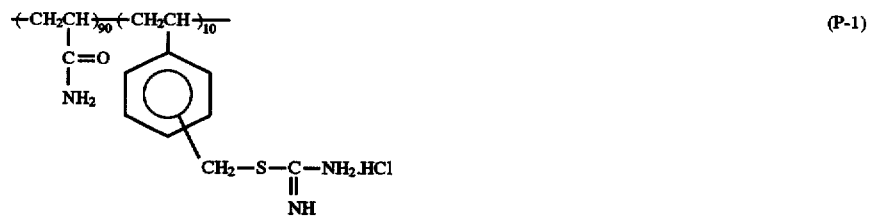

(P-1)

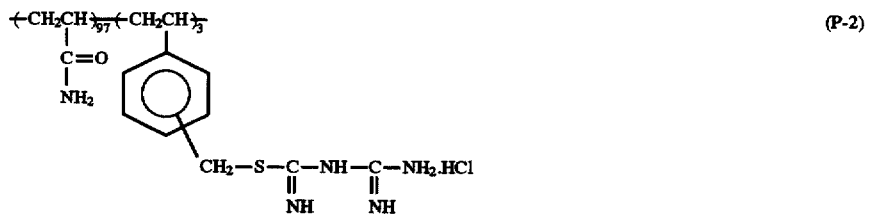

(P-2)

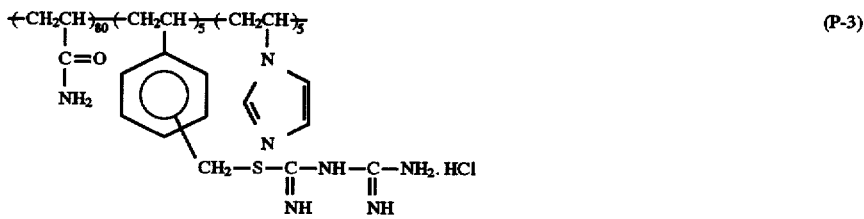

(P-3)

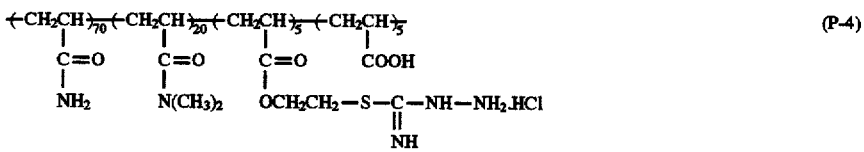

(P-4)

-continued
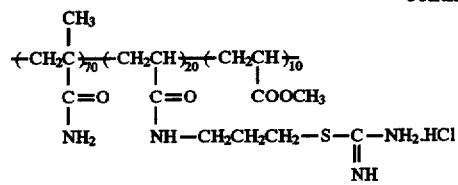 (P-5)
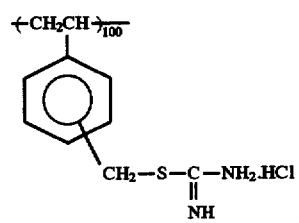 (P-6)
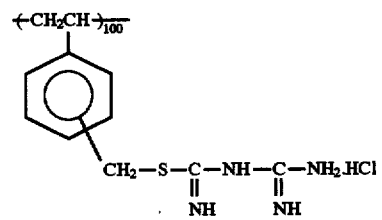 (P-7)
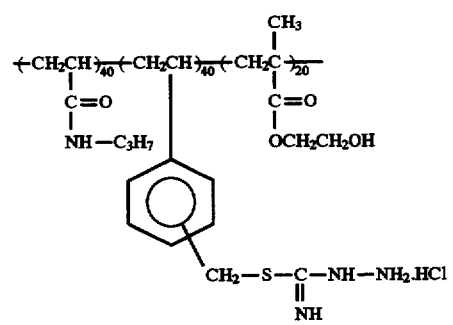 (P-8)
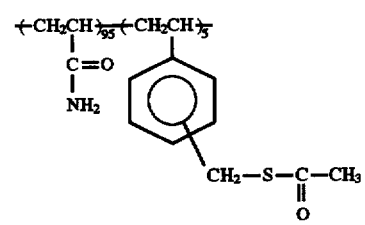 (P-9)
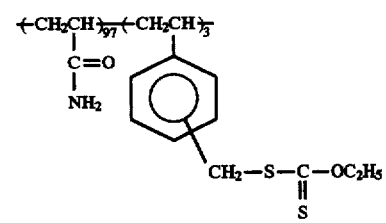 (P-10)
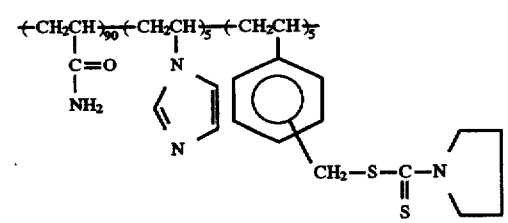 (P-11)

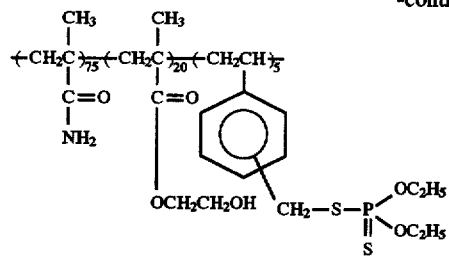 (P-12)
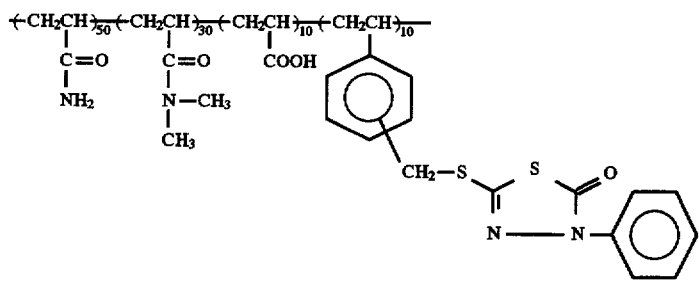 (P-13)
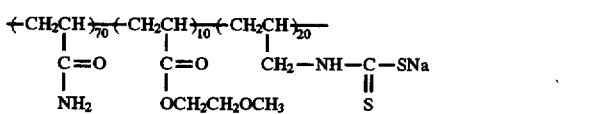 (P-14)
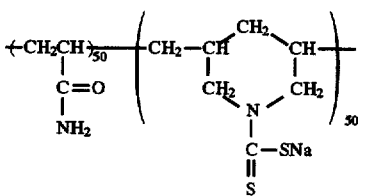 (P-15)
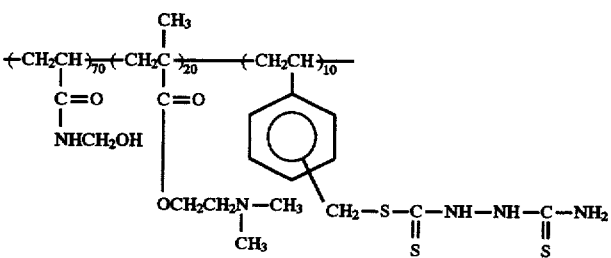 (P-16)
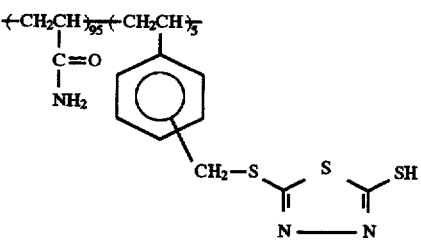 (P-17)
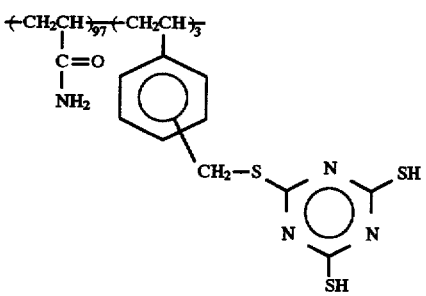 (P-18)

-continued

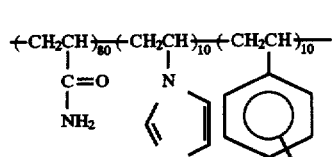 (P-19)

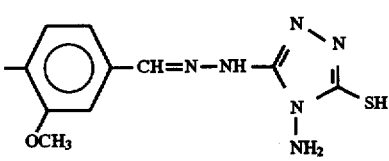 (P-20)

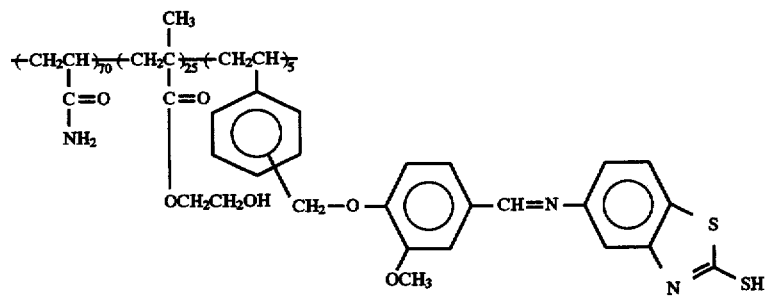

(P-21)

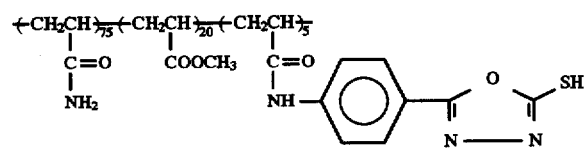 (P-22)

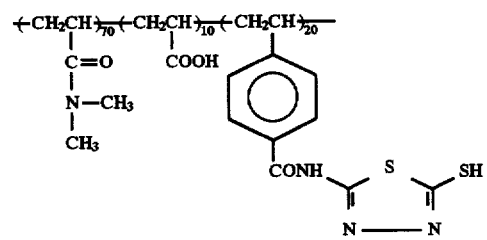 (P-23)

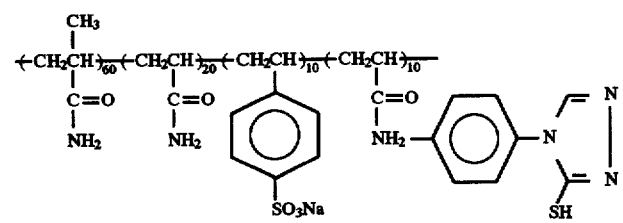 (P-24)

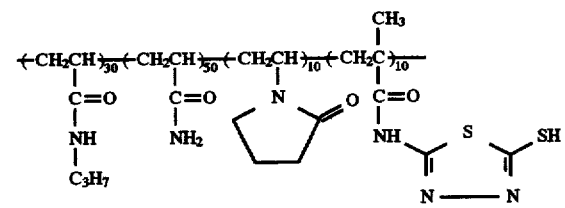

EXAMPLES

Synthetic example 1

(I) Synthesis of Polymer

Synthesis Example (Exemplary polymer P-1)

To a 500 ml four-necked flask equipped with a stirrer, a thermometer, a reflux tube and a nitrogen introducing tube were charged 45 g of acrylamide and 5 g of (a-1) (which was synthesized from thiourea and chloromethylstyrene (mixture of m- and p-isomers) in ethanol under reflux. Similarly, the compound (a-2) was synthesized from guanylthiourea and chloromethylstyrene, and others (a-3) to (a-8) were also synthesized in the same manner except for using the corresponding starting materials.), and then 200 g of distilled water and 100 g of ethanol were added thereto to dissolve the mixture. The flask was placed on a water bath heated to 50° C., and under nitrogen stream and stirring, 0.5 g of 2,2'-azobis(2-aminodipropane)dihydro chloride (V-50, trade name, available from Wako Junyaku K.K.) was added to the mixture as a polymerization initiator to start the polymerization. Stirring was carried out at 50° C. for one hour and stirring was further continued by raising the inner temperature of the flask to 75° C. for 3 hours. The polymer thus obtained had a weight average molecular weight of about 100,000 as a result of GPC analysis. According to completely the same procedure as mentioned above, the polymers shown as (P-2) to (P-8) were synthesized.

As the polymer for comparative purpose, polymers represented by the following formulae (R-1) and (R-2) were synthesized in the same manner.

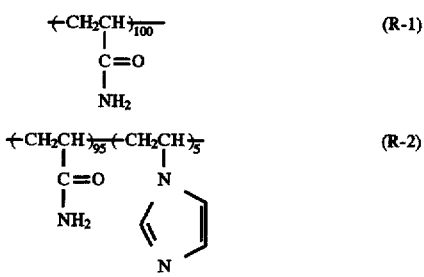

Synthetic example 2

(II) Synthesis of Polymer

Synthesis Example (Exemplary polymer P-9)

To a 500 ml four-necked flask equipped with a stirrer, a thermometer, a reflux tube and a nitrogen introducing tube were charged 45 g of acrylamide and 5 g of (b-1) (which was synthesized from thioacetic acid and chloromethylstyrene (mixture of m- and p-isomers) in a water/ethanol mixed solvent (1:2) under reflux. Similarly, the compound (b-2) was synthesized from sodium xanthogenate and chloromethylstyrene, and others (b-3) to (b-8) were also synthesized in the same manner except for using the corresponding starting materials.), and then 200 g of distilled water and 100 g of ethanol were added thereto to dissolve the mixture. The flask was placed on a water bath heated to 50° C., and under nitrogen stream and stirring, 0.5 g of 2,2'-azobis(2,4-dimethylvaleronitrile) (V-65, trade name, available from Wako Junyaku K.K.) was added to the mixture as a polymerization initiator to start the polymerization. Stirring was carried out at 50° C. for one hour and stirring was further continued by raising the inner temperature of the flask to 75° C. for 3 hours. The polymer thus obtained had a weight average molecular weight of 110,000 as a result of GPC analysis. According to completely the same procedure as mentioned above, the polymers shown as (P-9) to (P-16) were synthesized.

Synthetic example 3

(III) Synthesis of Polymer

Synthesis Example (Exemplary polymer P-18)

To a 500 ml four-necked flask equipped with a stirrer, a thermometer, a reflux tube and a nitrogen introducing tube were charged 45 g of acrylamide and 5 g of (c-1) (which was synthesized from bismuthiol(2,5-dimercapto-1,3,4-thiadiazole) and chloromethylstyrene (mixture of m- and p-isomers) in a water/ethanol mixed solvent (1:2) in the presence of an equimolar amount of sodium hydroxide) under reflux. Similarly, the compound (c-2) was synthesized from monosodium thiocyanurate and chloromethylstyrene, and others (c-3) to (c-8) were also synthesized in the same manner except for using the corresponding starting materials.), and then 0.7 g of sodium hydroxide was added, subsequently 200 g of distilled water and 100 g of ethanol were added thereto to dissolve the mixture. The flask was placed on a water bath heated to 50° C., and under nitrogen stream and stirring, 0.5 g of 2,2'-azobis(2,4-dimethylvaleronitrile) (V-65, trade name, available from Wako Junyaku K.K.) was added to the mixture as a polymerization initiator to start the polymerization. Stirring was carried out at 50° C. for one hour and stirring was further continued by raising the inner temperature of the flask to 75° C. for 3 hours. The polymer thus obtained had a weight average molecular weight of 70,000 as a result of GPC analysis. According to completely the same procedure as mentioned above, the polymers shown as (P-17) and (P-19) to (P-24) were synthesized.

Example 1

(I) Preparation of lithographic printing plate

A gelatin solution containing silica particles and carbon black was coated on a sheet of polyethylene coated paper with 135 g/m² which had been subjected to corona discharge treatment. Then, an orthochromatically sensitized high-contrast silver halide emulsion was coated over the gelatin coating. The emulsion layer was composed essentially of 1.5 g/m² of silver halide in terms of silver nitrate and 1.5 g/m² of gelatin, and contained formalin and dimethylolurea as hardening agents. The above photosensitive silver halide photographic material was processed for 3 days at 40° C., and then coated with a coating solution containing physical development nuclei and the polymer of the present invention prepared according tot he following prescriptions.

(1) Preparation of palladium sulfate sol

| Solution A: | |
| --- | --- |
| Palladium chloride | 5 g |
| Hydrochloric acid | 40 ml |
| Distilled water | 1000 ml |
| Solution B: | |
| Sodium sulfide | 8.6 g |
| Distilled water | 1000 ml |

The solutions A and B were mixed with stirring. After 30 minutes, the resulting mixture was passed through a column packed with ion-exchange resin (IR-120E, IRA-400, both trade names, available from Rohm & Haas Co.) to obtain a palladium sulfate sol.

(2) Preparation of physical development nuclei coating solution containing the polymer of the present invention

| | |
| --- | --- |
| The above palladium sulfate sol | 100 ml |
| Hydroquinone | 100 g |
| Polymer of the present invention (as a solid component) | 5 g |
| 10% Saponin (Surfactant) | 2 ml |
| Make up to 2000 ml with addition of water. | |

On the silver halide photographic material obtained as mentioned above was coated the above coating solution to obtain a lithographic printing plate.

(III) Processing

The photosensitive material obtained above was exposed in accordance with an image, then immersed into a transfer developer (C) of the following prescription at 30° C. for 30 seconds to carry out transfer development, subsequently immersed in a stop bath of the following prescription (D) at 25° C. for 30 seconds, then squeezed to remove excess sollution, and air-dried under atmospheric conditions.

Prescription (C) (Transfer developer)

| Water | 1500 ml |
|---|---|
| Sodium hydroxide | 20 g |
| Sodium sulfite | 100 g |
| Hydroquinone | 12 g |
| 1-Phenyl-3-pyrazolidone | 1 g |
| Sodium thiosulfate | 10 g |
| Potassium thiocyanate | 5 g |
| Potassium bromide | 5 g |
| Make up the total volume to 2 liters with addition of water. | |

Prescription (D) (Stop bath)

| Water | 2 liters |
|---|---|
| Citric acid | 10 g |
| Sodium citrate | 35 g |

(IV) Printing

The printing plate thus prepared was mounted on an offset press (Ryobi 3200 CD (OFFSET DUPLICATOR), trade name, manufactured by Ryobi Limited). The plate surface was wiped with a solution of the prescription (E) and the plate was used in printing. The printing room was at a temperature of 22° C. and a relative humidity of 60%.

Prescription (E)

| Water | 400 ml |
|---|---|
| Citric acid | 1 g |
| Sodium citrate | 3.5 g |
| 2-Mercapto-5-heptyl1,3,5-oxadiazol | 0.5 g |
| Ethylene glycol | 50 ml |

For damping, a commercially available damping water was used, and for the printing inks, "F Gloss Sumi B" and "F Gloss Kon-Ai" (both trade names, available from Dainippon Ink Inc.) were used. The "F Gloss Kon-Ai" was one of those which were liable to cause toning when used with conventional offset printing plate.

(V) Evaluation of photographic characteristics

As for the printing plates obtained as mentioned above and the printing plates obtained by using the comparative polymer represented by the formulae (R-1) and (R-2) in place of the polymer of the present invention, exposure was carried out through optical wedge and reflective densities of the developed printing plates were measured by using a usual optical densitometer to obtain sensitivity (S) and contrast (gamma γ). The sensitivity (S) is shown with a relative value to the value of the comparative polymer (R-1) as 100. Also, in order to examine deterioration of the printing plates when they were preserved under heating, fresh printing plates were heated at 50° C. for 4 days. Thereafter, the same treatments as mentioned above were carried out to obtain sensitivity (S') and contrast (gamma γ') after the heat treatment were measured. The results are shown in Table 1.

TABLE 1

| Sample No. | Polymer Exemplary compound | Polymer Molecular weight (Mw) | Fresh S | Fresh γ | After preservation under heating S' | After preservation under heating γ' |
|---|---|---|---|---|---|---|
| 1 | (P-1) | 100,000 | 107 | 5.3 | 107 | 5.4 |
| 2 | (P-2) | 120,000 | 102 | 5.4 | 103 | 5.3 |
| 3 | (P-3) | 90,000 | 101 | 5.1 | 100 | 5.1 |
| 4 | (P-4) | 50,000 | 100 | 5.0 | 101 | 5.1 |
| 5 | (P-5) | 80,000 | 109 | 5.3 | 102 | 5.1 |
| 6 | (P-6) | 100,000 | 108 | 5.2 | 105 | 5.3 |
| 7 | (P-7) | 40,000 | 105 | 5.4 | 107 | 5.1 |
| 8 | (P-8) | 30,000 | 102 | 5.1 | 105 | 5.0 |
| 9 | (R-1) | 80,000 | 100 | 5.1 | 97 | 4.9 |
| 10 | (R-2) | 100,000 | 98 | 5.2 | 99 | 5.0 |

From the results shown in Table 1, it can be understood that the lithographic printing plate prepared by using the polymers having the functional groups according to the present invention showed high sensitivity and had high contrast as compared with those of using the comparative polymers (R-1) and (R-2). Also, after preservation under heating, substantially no change in photographic characteristics can be admitted whereby it can be understood that the lithographic printing plate prepared by using the polymers can maintain good characteristics stably.

(VI) Evaluation in printing characteristics

Next, by using the printing plates obtained as mentioned above, printing was carried out according to the aforesaid offset press according to the predetermined procedure. Evaluation of the printing characteristics was conducted by judging the degree of toning on printing of the printed material with eyes and rating with the following five standards.

5 ... No toning.
4 ... Substantially no toning (middle of 5 and 3).
3 ... Toning exists partially.
2 ... Middle of 3 and 1.
1 ... Slight toning appeared whole surface.

The results are shown in Table 2. Further, as the evaluation of press life, printing of 5,000 sheets was carried out under the same conditions and then evaluated. As the results, all of the printing plates including comparative plates using comparative polymers showed that they can carry out printing without any problem.

TABLE 2

| Sample No. | Polymer | Fresh | After preservation under heating | Remarks |
|---|---|---|---|---|
| 1 | (P-1) | 5 | 5 | Present invention |
| 2 | (P-2) | 5 | 5 | Present invention |
| 3 | (P-3) | 4 | 5 | Present invention |
| 4 | (P-4) | 5 | 4 | Present invention |
| 5 | (P-5) | 4 | 5 | Present invention |
| 6 | (P-6) | 5 | 4 | Present invention |
| 7 | (P-7) | 4 | 5 | Present invention |

TABLE 2-continued

| Sample No. | Polymer | Fresh | After preservation under heating | Remarks |
|---|---|---|---|---|
| 8 | (P-8) | 5 | 5 | Present invention |
| 9 | (R-1) | 1 | 1 | Comparative |
| 10 | (R-2) | 1 | 1 | Comparative |

From the results shown in Table 2, the printing plates using the water-soluble polymer of the present invention showed that the degree of toning on printing can be markedly improved as compared to those of the comparative samples and also showed stable printing characteristics after preservation under heating.

Example 2

In the same manner as in Example 1 except for using water-soluble polymers (P-9) to (P-16), lithographic printing plates were prepared.

As for the printing plates obtained as mentioned above and the printing plates obtained by using the comparative polymer represented by the formulae (R-1) and (R-2), exposure was carried out in the same manner as in Example 1 and the same measurements were carried out. The results are shown in Table 3.

TABLE 3

| Sample No. | Polymer Exemplary compound | Molecular weight (Mw) | Fresh S | γ | After preservation under heating S' | γ' |
|---|---|---|---|---|---|---|
| 11 | (P-9) | 110,000 | 104 | 5.4 | 105 | 5.4 |
| 12 | (P-10) | 70,000 | 104 | 5.3 | 105 | 5.3 |
| 13 | (P-11) | 70,000 | 108 | 5.1 | 107 | 5.4 |
| 14 | (P-12) | 80,000 | 104 | 5.0 | 103 | 5.1 |
| 15 | (P-13) | 50,000 | 101 | 5.2 | 102 | 5.2 |
| 16 | (P-14) | 30,000 | 104 | 5.1 | 104 | 5.4 |
| 17 | (P-15) | 20,000 | 106 | 5.4 | 106 | 5.3 |
| 18 | (P-16) | 70,000 | 106 | 5.1 | 106 | 5.2 |
| 19 | (R-1) | 80,000 | 100 | 5.1 | 97 | 4.9 |
| 20 | (R-2) | 100,000 | 98 | 5.2 | 99 | 5.0 |

From the results shown in Table 3, it can be understood that the lithographic printing plate prepared by using the polymers having the functional groups according to the present invention showed high sensitivity and had high contrast as compared with those of using the comparative polymers (R-1) and (R-2). Also, after preservation under heating, substantially no change in photographic characteristics can be admitted whereby it can be understood that the lithographic printing plate prepared by using the polymers can maintain good characteristics stably.

Next, in the same manner as in Example 1, evaluation of the printing characteristics of the obtained lithographic printing plates was conducted with the same rating system as in Example 1. The results are shown in Table 4.

Further, as the evaluation of press life, printing of 5,000 sheets was carried out under the same conditions and then evaluated. As the results, all of the printing plates including comparative plates using comparative polymers showed that they can carry out printing without any problem.

TABLE 4

| Sample No. | Polymer | Fresh | After preservation under heating | Remarks |
|---|---|---|---|---|
| 11 | (P-9) | 5 | 5 | Present invention |
| 12 | (P-10) | 4 | 5 | Present invention |
| 13 | (P-11) | 5 | 4 | Present invention |
| 14 | (P-12) | 4 | 4 | Present invention |
| 15 | (P-13) | 4 | 5 | Present invention |
| 16 | (P-14) | 4 | 4 | Present invention |
| 17 | (P-15) | 4 | 5 | Present invention |
| 18 | (P-16) | 4 | 4 | Present invention |
| 19 | (R-1) | 1 | 1 | Comparative |
| 20 | (R-2) | 1 | 1 | Comparative |

From the results shown in Table 4, the printing plates using the water-soluble polymer of the present invention showed that the degree of toning on printing can be markedly improved as compared to those of the comparative samples and also showed stable printing characteristics after preservation under heating.

Example 3

In the same manner as in Example 1 except for using water-soluble polymers (P-17) to (P-24), lithographic printing plates were prepared.

As for the printing plates obtained as mentioned above and the printing plates obtained by using the comparative polymer represented by the formulae (R-1) and (R-2), exposure was carried out in the same manner as in Example 1 and the same measurements were carried out. The results are shown in Table 5.

TABLE 5

| Sample No. | Polymer Exemplary compound | Molecular weight (Mw) | Fresh S | γ | After preservation under heating S' | γ' |
|---|---|---|---|---|---|---|
| 21 | (P-17) | 80,000 | 110 | 5.5 | 108 | 5.4 |
| 22 | (P-18) | 70,000 | 108 | 5.3 | 104 | 5.3 |
| 23 | (P-19) | 100,000 | 107 | 5.2 | 105 | 5.2 |
| 24 | (P-20) | 40,000 | 102 | 5.1 | 101 | 5.3 |
| 25 | (P-21) | 70,000 | 104 | 5.3 | 102 | 5.4 |
| 26 | (P-22) | 50,000 | 106 | 5.2 | 107 | 5.5 |
| 27 | (P-23) | 20,000 | 105 | 5.2 | 107 | 5.2 |
| 28 | (P-24) | 60,000 | 105 | 5.1 | 105 | 5.0 |
| 29 | (R-1) | 80,000 | 100 | 5.1 | 97 | 4.9 |
| 30 | (R-2) | 100,000 | 98 | 5.2 | 99 | 5.0 |

From the results shown in Table 5, it can be understood that the lithographic printing plate prepared by using the polymers having the functional groups according to the present invention showed high sensitivity and had high contrast as compared with those of using the comparative polymers (R-1) and (R-2). Also, after preservation under heating, substantially no change in photographic characteristics can be admitted whereby it can be understood that the lithographic printing plate prepared by using the polymers can maintain good characteristics stably.

Next, in the same manner as in Example 1, evaluation of the printing characteristics of the obtained lithographic printing plates was conducted with the same rating system as in Example 1. The results are shown in Table 6.

Further, as the evaluation of press life, printing of 5,000 sheets was carried out under the same conditions and then evaluated. As the results, all of the printing plates including comparative plates using comparative polymers showed that they can carry out printing without any problem.

TABLE 6

| Sample No. | Polymer | Fresh | After preservation under heating | Remarks |
|---|---|---|---|---|
| 21 | (P-17) | 4 | 4 | Present invention |
| 22 | (P-18) | 4 | 5 | Present invention |
| 23 | (P-19) | 4 | 5 | Present invention |
| 24 | (P-20) | 4 | 4 | Present invention |
| 25 | (P-21) | 4 | 5 | Present invention |
| 26 | (P-22) | 5 | 4 | Present invention |
| 27 | (P-23) | 4 | 5 | Present invention |
| 28 | (P-24) | 4 | 5 | Present invention |
| 29 | (R-1) | 1 | 1 | Comparative |
| 30 | (R-2) | 1 | 1 | Comparative |

From the results shown in Table 6, the printing plates using the water-soluble polymer of the present invention showed that the degree of toning on printing can be markedly decreased as compared to those of the comparative samples and also showed stable printing characteristics after preservation under heating.

We claim:

1. A lithographic printing plate comprising a support having thereon a silver halide emulsion layer and a layer containing physical development nuclei, wherein said layer containing physical development nuclei further includes a water-soluble polymer having a structural unit represented by the formula (I):

wherein $R^1$ represents a hydrogen atom or a lower alkyl group having 1 to 6 carbon atoms; Q represents a divalent linking group; $R^2$ represents a divalent linking group or a direct bonding arm;
and A represents —S—C(=N—$R^4$)—NH—$R^3$, —Z—X (=Y)—($R^5$)$_m$ or —W—(SH)$_n$;

where $R^3$ represents a hydrogen atom, an alkyl group, a phenyl group, an amino group or an amidino group; $R^4$ represents a hydrogen atom or an amino group; Z represents a sulfur atom, a nitrogen atom or a NH group; X represents a carbon atom or a phosphorous atom; Y represents an oxygen atom, a sulfur atom or =N—; $R^5$ represents an alkyl group, an alkoxy group, an aryl group, a pyrrolidino group, a piperidino group, a mercapto group or a thiosemicarbazido group; m is 1 when X is a carbon atom or 2 when X is a phosphorus atom; provided that when Z is a nitrogen atom, two —Q—$R^2$—'s are bonded thereto, when X is a phosphorus atom, two $R^5$'s may be the same or different and are alkoxy groups bonded to X; when Y is =N—, X, Y and $R^5$ form a heterocyclic ring; and when Z is a nitrogen atom or a NH group, the moiety —X(=Y)—$R^5$ represents a dithiocarbamic acid group, a salt thereof or a N-substituted thiourea residue; W represents a nitrogen-containing heterocyclic ring; and n represents an integer of 1 or 2.

2. The plate according to claim 1, wherein $R^1$ is a hydrogen atom or a methyl group.

3. The plate according to claim 1, wherein Q is a divalent linking group selected from the group consisting of an alkylene group having 2 to 7 carbon atoms, a phenylene group, an aralkylene group, a COO group, a NHCOO group, a NHCOOC$_2$H$_4$ group and a CONH group.

4. The plate according to claim 1, wherein $R^2$ is a divalent linking group selected from the group consisting of an alkylene group having 2 to 7 carbon atoms; an alkyleneoxy group having 2 to 7 carbon atoms; an arylene group; and a divalent linking group represented by the formula:

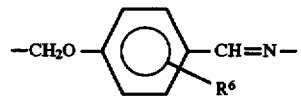

wherein $R^6$ represents a hydrogen atom or a methoxy group,
or a direct bonding arm.

5. The plate according to claim 1, wherein the water-soluble polymer has the structural unit represented by the formula (A-1):

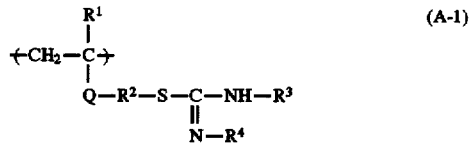

wherein $R^1$, Q, $R^2$, $R^3$ and $R^4$ have the same meanings as defined in claim 1.

6. The plate according to claim 1, wherein the water-soluble polymer has the structural unit represented by the formula (B-1):

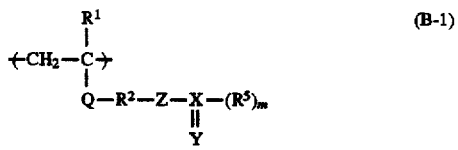

wherein $R^1$, Q, $R^2$, Z, X, Y, $R^5$ and m have the same meanings as defined in claim 1.

7. The plate according to claim 1, wherein the water-soluble polymer has the structural unit represented by the formula (C-1):

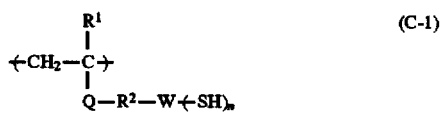

wherein $R^1$, Q, $R^2$, W and n have the same meanings as defined in claim 1; or —Q—$R^2$— represents a divalent linking group represented by the following formula (C-2):

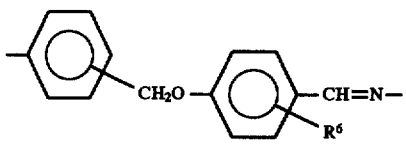 (C-2)

where $R^6$ represents a hydrogen atom or a methoxy group.

8. The plate according to claim 5, wherein the structural unit represented by the formula (A-1) is contained in the water-soluble polymer in an amount of 0.1 to 100% by weight.

9. The plate according to claim 6, wherein the structural unit represented by the formula (B-1) is contained in the water-soluble polymer in an amount of 0.1 to 50% by weight.

10. The plate according to claim 7, wherein the structural unit represented by the formula (C-1) is contained in the water-soluble polymer in an amount of 0.1 to 50% by weight.

11. The plate according to claim 1, wherein the water-soluble polymer has the weight average molecular weight of 5,000 to 1,000,000.

* * * * *